United States Patent
Yeh et al.

(10) Patent No.: US 7,215,073 B2
(45) Date of Patent: May 8, 2007

(54) ACTIVE ORGANIC LIGHT EMITTING DIODE DISPLAY STRUCTURE

(75) Inventors: Yung-Hui Yeh, Hsinchu (TW); Chi-Lin Chen, Hsinchu (TW); Yu-Lung Liu, Hsinchu (TW); Ching-Hsuan Tang, Hsinchu (TW); Lung-Pin Hsin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 140 days.

(21) Appl. No.: 10/673,324

(22) Filed: Sep. 30, 2003

(65) Prior Publication Data

US 2004/0263065 A1 Dec. 30, 2004

(30) Foreign Application Priority Data

Jun. 26, 2003 (TW) .............................. 92117409 A

(51) Int. Cl.
*H05B 33/00* (2006.01)
*H01L 51/50* (2006.01)

(52) U.S. Cl. ...................... 313/500; 313/505; 313/501; 313/504; 313/506

(58) Field of Classification Search ................ 313/503, 313/504, 500, 505; 349/43, 110
See application file for complete search history.

(56) References Cited

U.S. PATENT DOCUMENTS

| | | | | |
|---|---|---|---|---|
| 5,327,001 A * | 7/1994 | Wakai et al. | ................ | 349/110 |
| 5,818,550 A * | 10/1998 | Kadota et al. | ................ | 349/43 |
| 6,038,006 A * | 3/2000 | Sasaki et al. | ................ | 349/110 |
| 6,057,896 A * | 5/2000 | Rho et al. | ...................... | 349/43 |
| 6,429,916 B1 * | 8/2002 | Nakata et al. | ............... | 349/110 |
| 6,515,428 B1 * | 2/2003 | Yeh et al. | ................... | 313/504 |
| 2002/0192576 A1 * | 12/2002 | Matsuoka et al. | .......... | 313/498 |

FOREIGN PATENT DOCUMENTS

EP 1178709 A1 * 2/2002

* cited by examiner

*Primary Examiner*—Mariceli Santiago
(74) *Attorney, Agent, or Firm*—Quintero Law Office

(57) ABSTRACT

The present invention discloses an active organic light emitting diode (AOLED) display structure. A color filter and thin film transistor organic light emitting diode (TFT-OLED) are incorporated on one substrate of the AOLED. Moreover, a Indium Tin Oxide(ITO)layer of the AOLED is deposited with a black matrix layer so as to lower light leakage effect and increase the contrast and color purity level in between pixels of the display. By adopting such technology, a flat panel display having large area, high resolution and low product cost is accordingly implemented.

11 Claims, 2 Drawing Sheets

ACTIVE ORGANIC LIGHT EMITTING
DIODE DISPLAY STRUCTURE

FIELD OF THE INVENTION

The present invention generally relates to an active organic light emitting diode (AOLED) display structure, and, more particularly, the present invention relates to an organic light emitting diode (OLED) display structure applied in a flat panel display.

BACKGROUND OF THE INVENTION

Professor Pope in New York University announced a paper about single layer blue light organic component in J. Chem. Phys. in 1963. Since then, studies related to organic light emitting diode have been undertaken and gradually become an important field in the display industry. Due to the unique features of OLED such as flexibility, low cost, self-illumination, and full color, efforts been dedicated to the research of OLED and related commercial applications are proposed.

Features such as self-illumination, high contrast and low power consumption of OLED has made it the mainstream technology chosen for next generation displays. However, overly high implementing cost and low resolution display problems occur to color OLED technologies such as vacuum evaporation and ink jet printing are unsolved in commercial applications of OLED. A solution was suggested in U.S. Pat. No. 6,392,460. FIG. 1 illustrates an embodiment of the patented technology, where a TFT-OLED Plate 17 and a color filter 22 are coupled by adhering. The process required precise alignment and higher manufacturing cost. In addition, the techniques disclosed in the patent is restricted to a top-emission structure OLED and as a result has a limited application range.

SUMMARY OF THE INVENTION

The main objective of the present invention is to provide an active organic light emitting diode display Structure wherein a color filter and thin film transistor organic light emitting diodes (TFT-OLED) are incorporated on one substrate of the AOLED. Moreover, a Indium Tin Oxide (ITO) layer of the AOLED is deposited with a black matrix layer in the AOLED so as to implement a flat panel display having large area, high resolution and low product cost.

The present invention generally relates to an active organic light emitting diode display structure. The active organic light emitting diode display structure comprises a glass substrate, an active component layer, an intermediate insulate layer, a color filter area, an electrical conducting layer, a black matrix layer, an organic light emitting diode layer and a cathode ray layer. The active component layer is disposed on the glass substrate. The intermediate insulate layer is disposed on the top of the active component layer. The color filter area is disposed on part of the surface of the intermediate insulate layer. The electrical conducting layer is disposed above the color filter area. The black matrix layer is disposed on the top surface of the electrical conducting layer. Moreover, the black matrix layer covers margins of the color filter area. In a preferred embodiment according to the present invention, the organic light emitting diode layer used is a white OLED disposed on the black matrix layer. The cathode ray layer is disposed on the organic light emitting diode layer.

The invention can be more fully understood by reading the following detailed description of the preferred embodiments, with reference made to the accompanying drawings.

DETAILED DESCRIPTION OF THE INVENTION

A color filter and thin film transistor organic light emitting diode (TFT-OLED) are incorporated on one substrate of the AOLED according to the present invention. Moreover, a Indium Tin Oxide (ITO) layer of the AOLED is deposited with a black matrix layer in the AOLED so as to implement a flat panel display having large area, high resolution, full color and low product cost.

Figure 1:
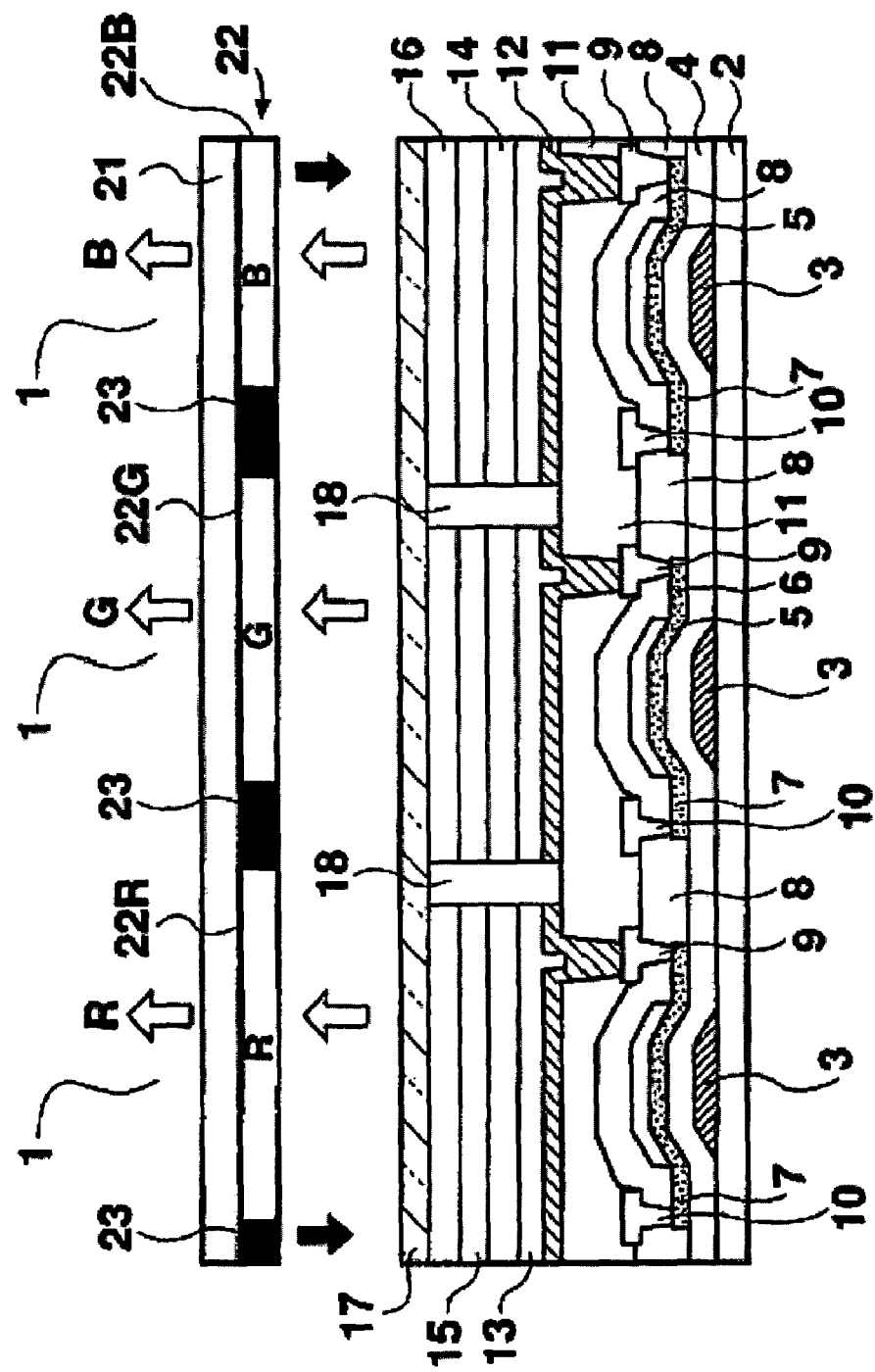
FIG. 1 is a schematic structure diagram illustrating a prior art organic light emitting diode display structure.
Figure 2:
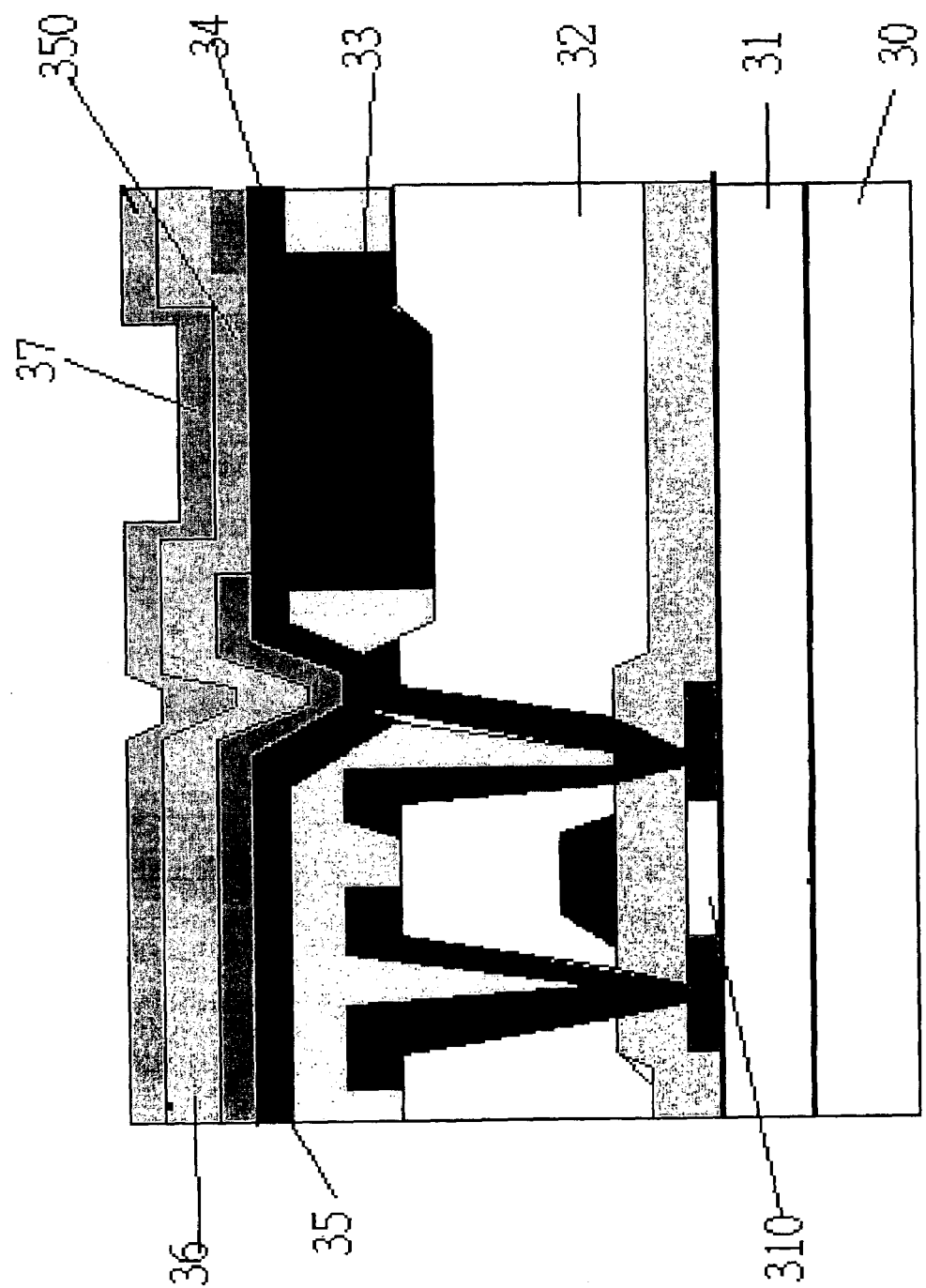
FIG. 2 is a schematic structure diagram illustrating a active organic light emitting diode display structure according to an preferred embodiment of the present invention.

Refers to FIG. 2, a schematic structure diagram of an active organic light emitting diode (AOLED) display structure according to an preferred embodiment of the present invention is illustrated. The AOLED comprises a glass substrate 30. The glass substrate 30 is made of non alkali glass. The AOLED comprises an active component layer. The active component layer has a buffer layer 31, disposed on the glass substrate 30. Poly-Si thin film transistors (poly-Si TFTs) 310 are disposed on top of the buffer layer 31. The AOLED also has an intermediate insulate layer 32, disposed on the poly-Si TFTs 310. The AOLED comprises a color filter area 33 is disposed on part of the surface of the intermediate insulate layer 32. The color filter area 33 is disposed on part of the surface of the intermediate insulate layer 32 by coating on the intermediate insulate layer 32. The AOLED comprises an electrical conducting layer 34, an ITO layer in the embodiment, which is disposed on top of the intermediate insulate layer 33 by sputtering. The AOLED comprises a black matrix layer 35 disposed on the top surface of the electrical conducting layer 34. The black matrix layer 35 has an opening 350. The opening 350 is located above the color filter area 33. The area of the opening 350 is slightly smaller than the area of the color filter area 33. The black matrix layer 35 covers margins of the color filter area 33 as well as the non color filter area 33. In the preferred embodiment, the materials of the black matrix layer 35 can be a metal thin film or a black photo resist thin film. The AOLED further comprises a organic light emitting diode layer 36, disposed on the black matrix layer 35. The AOLED also has a cathode electrode layer 37 disposed on the organic light emitting diode layer 36.

By adopting the structure mentioned above, a color filter and thin film transistor organic light emitting diode are incorporated on the same substrate of the AOLED. Whereby a flat panel display having large area, high resolution and low product cost is implemented. Further, a black matrix layer is utilized on the ITO electrical conducting layer for light blocking. Whereby not only light leakage to neighboring pixels from the color filter area of the OLED is prevented, also the edge field effect occurs to the transparent electrical conducting layer is lowered. The contrast and color purity level of the display according to the present invention are also increased.

Although the invention is illustrated and described herein with reference to particular embodiments, the invention is not intended to be limited to the details shown. Rather, various modifications may be made in the details within the scope and range of equivalents of the claims and without departing from the spirit of the invention.

What is claimed is:

1. An active organic light emitting diode display structure comprises:
    a glass substrate;
    an active component layer, disposed on the glass substrate;
    an intermediate insulate layer, disposed on the top of the active component layer;
    a color filter area, disposed on part of the surface of the intermediate insulate layer;
    an electrical conducing layer, disposed above the color filter area;
    a black matrix layer, disposed on the top surface of the electrical conducing layer, isolated from a gate electrode of the active component layer and covering margins of the color filter area;
    an organic light emitting diode layer, disposed on the black matrix layer; and
    a cathode ray layer, disposed in the organic light emitting diode layer.

2. The active organic light emitting diode display structure of claim 1, wherein the active component layer is a buffer layer having poly-Si thin film transistors (poly-Si TFTs).

3. The active organic light emitting diode display structure of claim 1, wherein the color filter area is coated on an area of the surface of the intermediate insulate layer.

4. The active organic light emitting diode display structure of claim 1, wherein the electrical conducting layer is an indium tin oxide (ITO) layer.

5. The active organic light emitting diode display structure of claim 1, wherein the black matrix layer is a metal thin film.

6. The active organic light emitting diode display structure of claim 1, wherein the black matrix layer is a black photo resist thin film.

7. The active organic light emitting diode display structure of claim 1, wherein the black matrix layer is disposed on the top surface of the electrical conducting layer, the black matrix layer has an opening, the opening is located above the color filter area, the area of the opening is lightly smaller than the area of the color filter area, and the black matrix layer covers margins of the color filter area as well as the non color filter area.

8. The active organic light emitting diode display structure of claim 7, wherein the organic light emitting diode is white organic light emitting diode.

9. The active organic light emitting diode display structure of claim 1, wherein the entirety of the black matrix layer is disposed on the top surface of the electrical conducting layer, the black matrix layer has an opening, the opening is located above the color filter area, the area of the opening is slightly smaller than the area of the color filter area, and the black matrix layer covers margins of the color filter area as well as the non color filter area.

10. The active organic light emitting diode display structure of claim 1, wherein the electrical conducting layer is disposed on the intermediate insulate layer by sputtering.

11. The active organic light emitting diode display structure of claim 1, wherein the active component layer is a buffer layer having poly-Si thin film transistors (poly-Si TFTs); the color filter area is coated on an area of the surface of the intermediate insulate layer; the electrical conducting layer is an indium tin oxide (ITO) layer; the black matrix layer is a metal thin film or a black photo resist thin film; the organic light emitting diode is white organic light emitting diode; the entirety of the black matrix layer is disposed on the top surface of the electrical conducting layer, the black matrix layer has an opening, the opening is located above the color filter area, the area of the opening is lightly smaller than the area of the color filter area, and the black matrix layer covers margins of the color filter area as well as the non color filter area; and the electrical conducting layer is disposed on the intermediate insulate layer by sputtering.

* * * * *